(12) United States Patent
Lim et al.

(10) Patent No.: US 6,399,471 B1
(45) Date of Patent: Jun. 4, 2002

(54) ASSORTED ALUMINUM WIRING DESIGN TO ENHANCE CHIP-LEVEL PERFORMANCE FOR DEEP SUB-MICRON APPLICATION

(75) Inventors: Yeow Kheng Lim; Randall Cher Liang Cha; Alex See; Wang Ling Goh; Victor Seng Keong Lim, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/783,379

(22) Filed: Feb. 15, 2001

(51) Int. Cl.[7] ............................................... H01L 21/44
(52) U.S. Cl. ..................................................... 438/599
(58) Field of Search ................................ 438/599, 618, 438/620, 622, 648, 672, 683, 688

(56) References Cited

U.S. PATENT DOCUMENTS

| | | | | |
|---|---|---|---|---|
| 5,960,309 A | | 9/1999 | Takano | 438/622 |
| 5,990,001 A | | 11/1999 | Oda | 438/633 |
| 6,026,225 A | * | 2/2000 | Iwasaki | 395/500 |
| 6,037,649 A | * | 3/2000 | Liou | 257/531 |
| 6,189,131 B1 | * | 2/2001 | Graef et al. | 716/8 |

* cited by examiner

*Primary Examiner*—David Nelms
*Assistant Examiner*—Quoc Hoang
(74) *Attorney, Agent, or Firm*—George O. Saile; Rosemary L. S. Pike; William J. Stoffel

(57) ABSTRACT

A method of manufacturing conductive lines that are thicker (not wider) in the critical paths areas. We form a plurality of first level conductive lines over a first dielectric layer. The first conductive lines run in a first direction. The first level conductive lines are comprised of a first level first conductive line and a second first level conductive line. We form a second dielectric layer over the first level conductive lines and the first dielectric layer. Next, we form a via opening in the second dielectric layer over a portion of the first level first conductive line. A plug is formed filling the via opening. We form a trench pattern in the second dielectric layer. The trench pattern is comprised of trenches that are approximately orthogonal to the first level conductive lines. We fill the trenches with a conductive material to form supplemental second lines. We form second level conductive lines over the supplemental second lines and the plug. The second level conductive lines are aligned parallel to the supplemental second lines. The supplemental second lines are formed under the critical path areas of the second level conductive lines. The second level conductive lines are not formed to contact the first level conductive lines where a contact is not desired. In the critical path areas of the second level conductive lines, the supplemental second lines underlie the second level conductive lines thereby increasing the effective overall wiring thickness in the critical path area thereby improving performance.

7 Claims, 5 Drawing Sheets

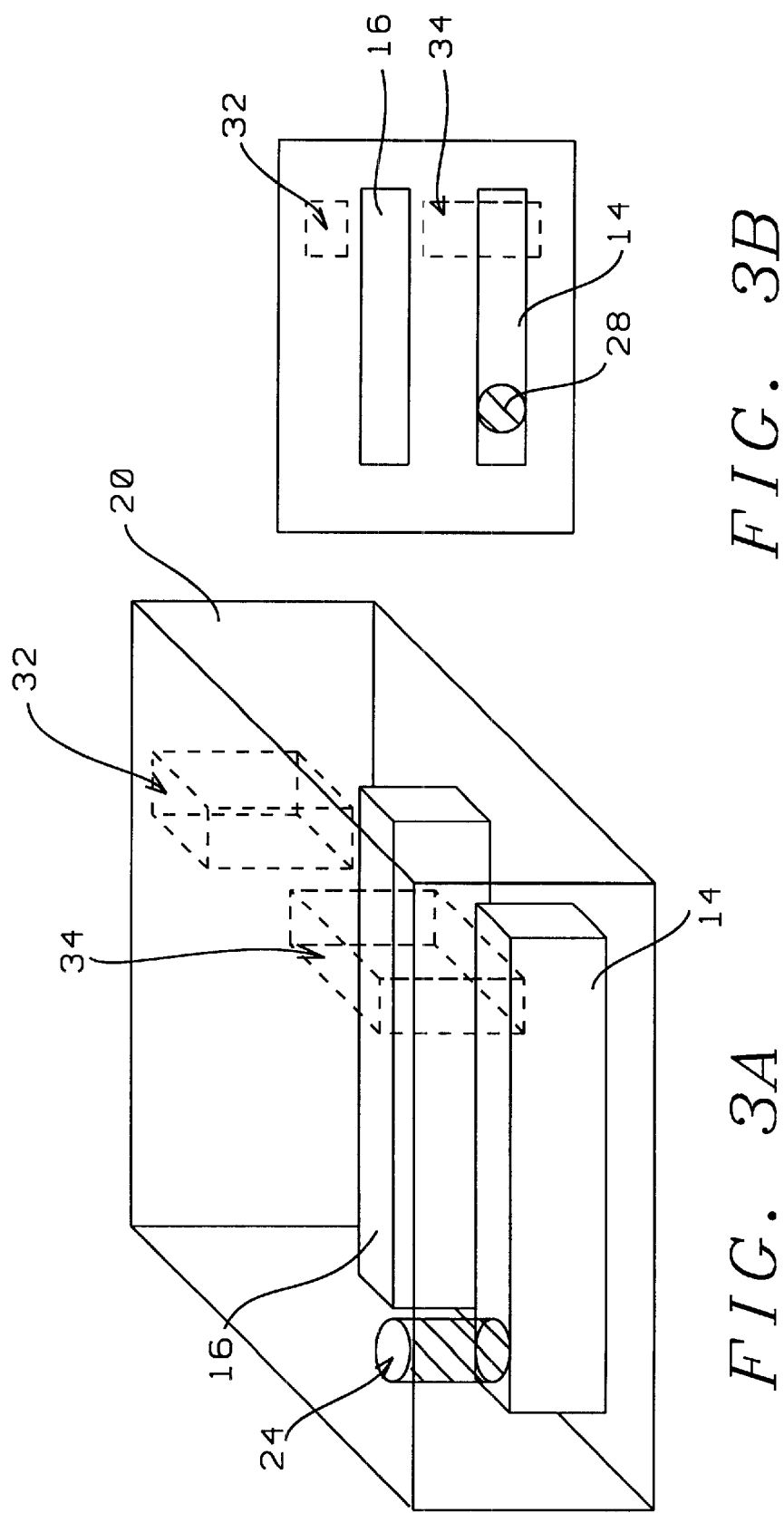

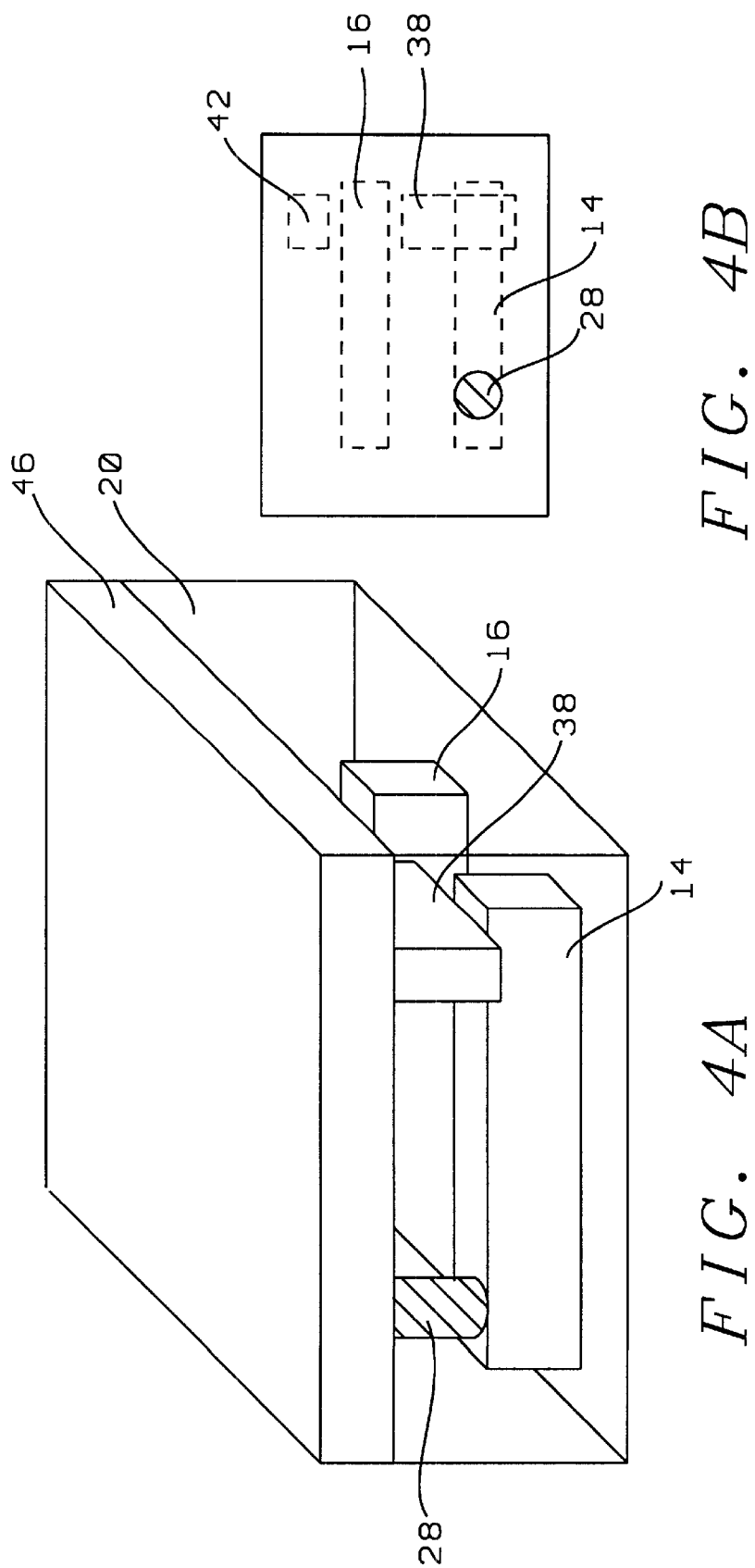

ASSORTED ALUMINUM WIRING DESIGN TO ENHANCE CHIP-LEVEL PERFORMANCE FOR DEEP SUB-MICRON APPLICATION

BACKGROUND OF INVENTION

1) Field of the Invention

This invention relates generally to fabrication of semiconductor devices having metal conductive lines and particularly to the fabrication of conductive lines that are thicker in critical path areas to improve performance and more particularly to the fabrication of conductive lines and underlying supplemental lines that together are thicker than only the conductive line in critical path areas of the conductive lines.

2) Description of the Prior Art

Wiring delay is a dominant factor in the performance for deep-submicron CMOS devices. With smaller devices, larger wiring delay per unit length is inevitable. In current technology, critical paths are usually made wider to reduce wiring resistance and double pitch is commonly employed. However the double pitch layers cause chip size to increase.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,990,001(Oda) that shows a process to lower the wiring delays by making the wire lines thicker in critical areas. However, this process is complicated.

U.S. Pat. No. 5,960,309(Takano) shows a method wires devices formed on a semiconductor integrated circuit. The method includes the steps of finding a wiring path between the devices, determining whether or not a delay in transmitting signals through the wiring path is within a predetermined range, and if the delay is out of the constraint, changing the number, or area, or both of them of throughholes of a given via in the wiring path so that the delay meets in the timing constraints. The integrated circuit thus wired is capable of handling signals that require severe delay.

However, these patents can be further improved upon.

SUMMARY OF THE INVENTION

It is an object of the present invention to provide a method for fabricating a conductive lines that are thicker for critical or major paths wirings.

It is an object of the present invention to provide a method for fabricating a conductive lines that are thicker for critical or major paths wirings by forming supplemental lines under the critical path areas of an overlying conductive lines.

It is another object of the present invention to provide a method for fabricating a conductive lines that are thicker for critical or major paths wirings by forming second supplemental lines under the critical path areas of an overlying second conductive lines.

To accomplish the above objectives, the present invention provides a method of manufacturing a conductive lines that are thicker for critical or major paths wirings which is characterized as follows. A semiconductor structure is provided having a top surface comprised of a first dielectric layer. Next, we form a plurality (e.g., spaced approximately parallel) of first level conductive lines over the first dielectric layer. The first conductive lines preferably run in a first direction during at least a portion of their length. The first level conductive lines comprised of a first level first conductive line and a first level second conductive line. We form a second dielectric layer over the first level conductive lines and the first dielectric layer. Next we form a via opening in the second dielectric layer over a portion of the first level first conductive line. A plug is formed filling the via opening.

Then, in a novel step, we form a trench pattern in the second dielectric layer. The trench pattern is comprised of trenches that are preferably about approximately orthogonal to the first level conductive lines. In a key step, we fill the trenches with a conductive material to form supplemental second lines. The supplemental second lines act as additional (or supplemental) thickness for the second level conductive lines hence they are called "supplemental second lines".

We form second level conductive lines over at least the supplemental second lines and the plug. The second level conductive lines are aligned parallel to the trenches. The trenches formed in critical path areas of the second level conductive lines. The supplemental second lines are not formed to contact the first level conductive lines where a contact is not desired. In the critical path areas of the second level conductive lines, the supplemental second lines underlie the second level conductive lines thereby increasing the effective overall wiring thickness in the critical path area thereby improving performance. Furthermore, once the trenches are etched, we can form the supplemental second lines and the second level conductive lines with one metal deposition and one metal etch step. This is a much simpler process.

The present invention to provide a method for fabricating a conductive lines that are thicker for critical or major paths wirings by forming second supplemental lines (e.g., 38 40 in FIG. 5A) under the critical path areas of an overlying second conductive lines.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A, 2A, 3A 4A and 5A are three dimensional views for illustrating a preferred embodiment of the invention's structure and method for forming conductive lines.

FIGS. 1B, 2B, 3B, 4B and 5B are a top plan views for illustrating for illustrating a preferred embodiment of the invention's structure and method for forming conductive lines.

DETAILED DESCRIPTION OF THE PREFERRED EMBODIMENTS

A. Overview of the Invention

Figures 5A, 5B:
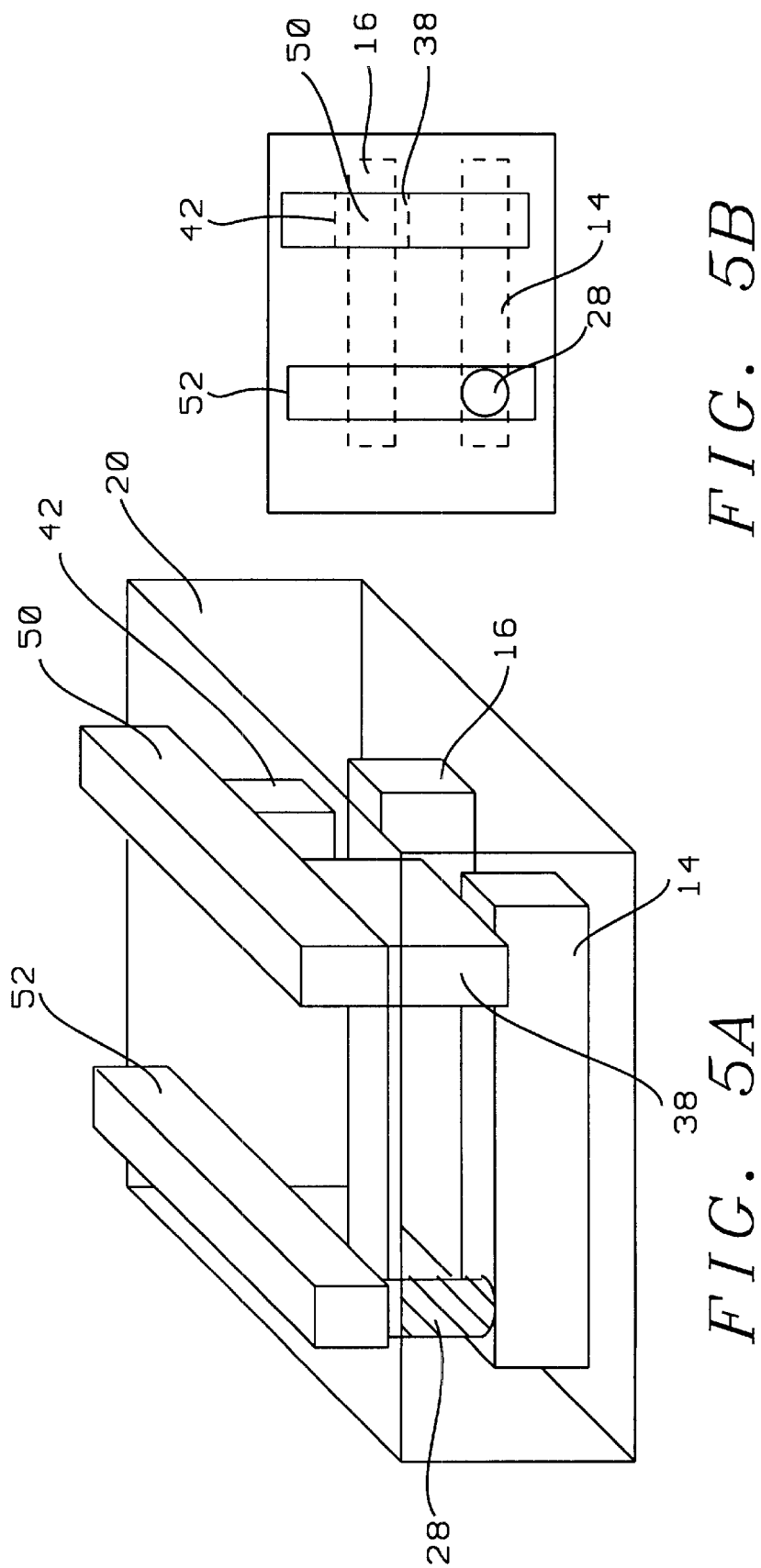

The present invention provides a method of manufacturing a conductive lines that are thicker in critical (or major) wirings paths (See FIGS. 5A and 5B). The invention forms supplemental lines 38 43 (See FIG. 5A) under a wiring layer (e.g., 50) in the critical path of the wiring layer. For example, the second wiring level (50 in FIG. 5A) has the overall thickness the in the critical path areas of the thickness of second level line (50) and the thickness of the second supplemental line(38).

The invention's supplement lines increase the effective cross sectional area of the wiring layer, without increasing the wiring line width. The invention's supplemental lines are formed after the via plugs (e.g., 28) (interconnects) are formed in a dielectric layer. Trenches 34 32 (FIG. 3A) are formed in the dielectric layer (20) where the supplement lines are desired, and a damascene process is used to form the supplemental lines. For example, as shown in FIGS. 5A and 5B, the supplemental second lines act as additional (or supplemental) thickness for the second level conductive line (50) hence they are called "supplemental second lines" 38 42.

Figure 1B:
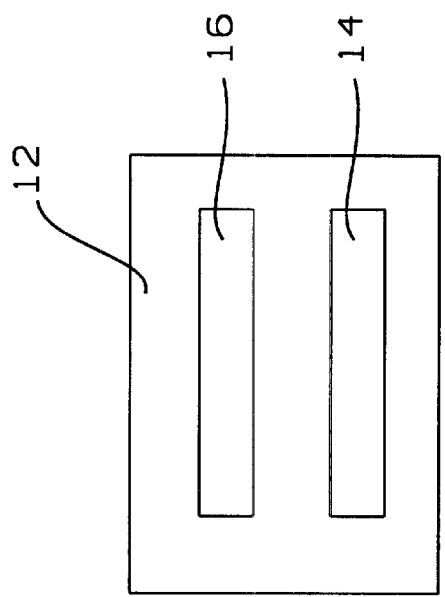
Figure 1A:
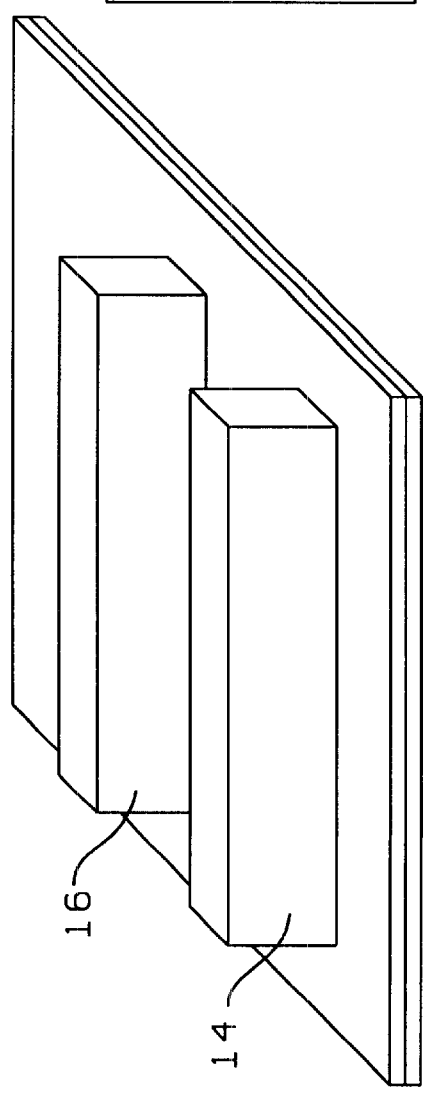

The major steps of the invention can be summarized as follows:

As shown in FIGS 1A and 1B, a semiconductor structure 10 is provided having a top surface comprised of a first dielectric layer 12.

Next we form a plurality (e.g., spaced parallel) of first level conductive lines 14 16 over the first dielectric layer 12. The first level conductive lines comprised of a first level first conductive line 14 and a second first level conductive line 16.

We form a second dielectric layer 20 over the first level conductive lines 14 16 and the first dielectric layer 12.

Next, we form a via opening 24 in the second dielectric layer 20 over a portion of the first level first conductive line 14.

As shown in FIGS. 3A and 3B, a plug 28 is formed filling the via opening 24.

As shown in FIGS. 3A and 3B, we form a trench pattern 34 32 in the second dielectric layer 20.

As shown in FIGS. 4A 4B, we fill the trenches with a conductive material to form supplemental second lines 38 42.

As shown in FIGS. 5A 5B, we form second level conductive lines 50 52 over the supplemental second lines 38 42 and the plug 28. The supplemental second lines 38 42 (and trenches) formed in critical path areas of the second level conductive lines.

B. Preferred Embodiment

Referring to FIGS 1A and 1B we provide a semiconductor structure 10 having a top surface comprised of a first dielectric layer 12. The semiconductor structure 10 can also comprise a top surface of a first dielectric layer 12 and conductive lines (not shown) (e.g., Polysilicon or Cu or aluminum alloy lines).

C. Semiconductor Structure

Semiconductor structure 10 is understood to possibly include a semiconductor substrate or wafer, active and passive devices formed within the wafer; and insulating and conductive layers formed on the wafer surface.

The term "structure" refers generally to a wafer or die having an intermediate integrated circuit structure formed thereon, typically including a silicon or other semiconductor layer having transistor or other semiconductor devices formed therein, a passivating field oxide layer over the semiconductor layer, metal or other conductive contacts extending down and through the oxide layer to the semiconductor layer and interconnects extending laterally over the surface of the passivating layer.

Within the present invention, the substrate may be a substrate employed within a microelectronics fabrication selected from the group including but not limited to integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication, or in the alternative, the substrate may be the substrate employed within tile microelectronics fabrication, where the substrate has formed thereupon or thereover any of several additional microelectronics layers as are conventionally employed within the microelectronics fabrication, Such additional microelectronics layers may include, but are not limited to, microelectronics conductor layers, microelectronics semiconductor layers and microelectronics dielectric layers, D. First Level Lines 14 16 and First Dielectric Layer Next, we form a plurality (e.g., spaced parallel) of first level conductive lines 14 16 over the first dielectric layer 12. The first dielectric layer can be an interlevel dielectric layer (ILD) or and inter metal dielectric (IMD) layer.

The first conductive lines have portions that preferably run in a first direction. The first level conductive lines are preferably comprised of a first level first conductive line 14 and a second first level conductive line 16. The first level conductive lines 14 16 are preferably comprised of an Al alloy, W or Cu lines (formed after a damascene process, then removing the mold). The first level conductive lines 14 16 are preferably formed by blanket depositing of a conductive layer and patterning the conductive layer using a conventional resist pattern and metal etch process.

The first conductive lines preferably have a thickness of between about 4000 and 5000 Å.

Figures 2A, 2B:
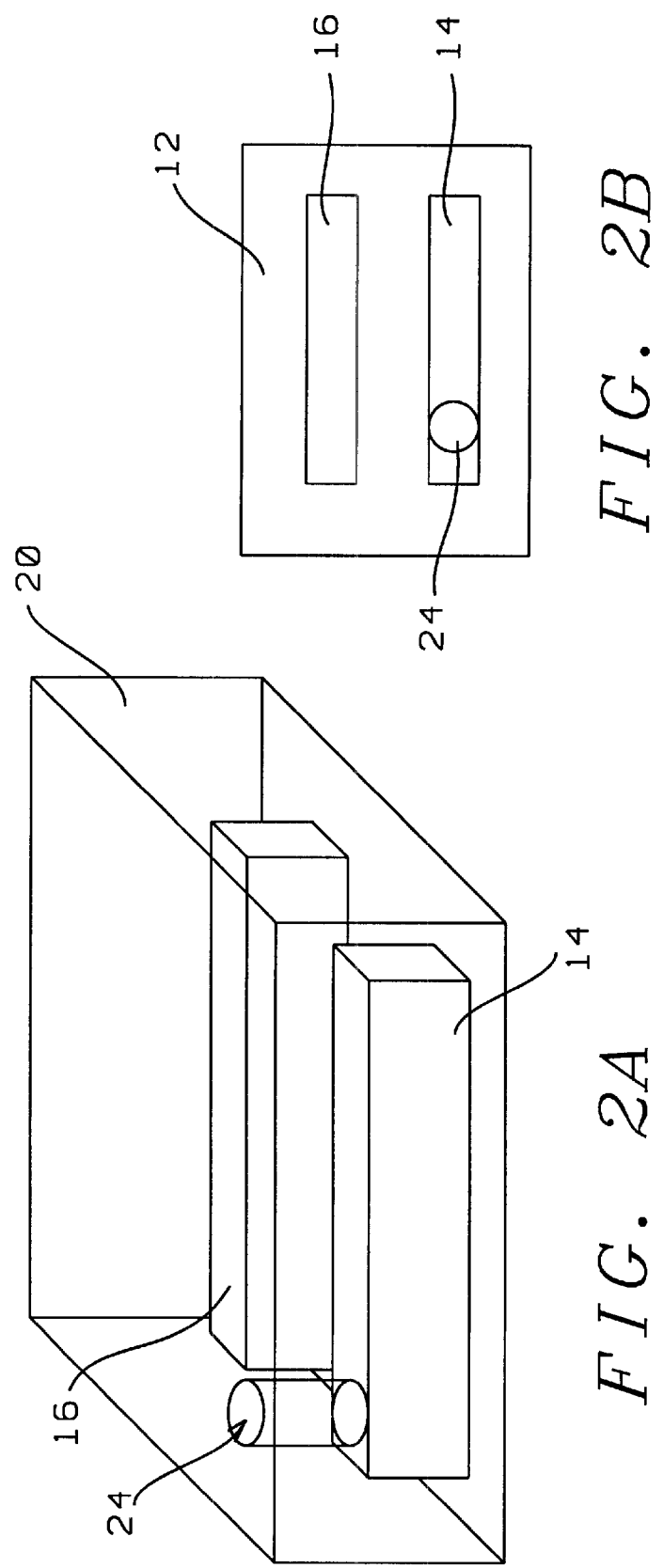

As shown in FIGS. 2A and 2B, we form a second dielectric layer 20 over the first level conductive lines 14 16 and the first dielectric layer 12. The second dielectric layer preferably is comprised of silicon oxide, or low k materials such as HSQ, MSq, Flare, SiLK, etc. The second dielectric layer preferably has a thickness of between about 10,000 and 14,000 Å.

E. Via Openings 24

Still referring to FIGS. 2A and 2B we form a via opening 24 in the second dielectric layer 20 over a portion of the first level first conductive line 14.

As shown in FIGS. 3A and 3B, we form a plug 28 filling the via opening 24. The plug 28 is preferably comprised of a barrier layer and an inner tungsten (W) plug.

Preferably we only use the Al "supplemental line" for critical lines. W plugs have better EM reliability as compared to Al plug, but resistance is higher.

F. Trench Pattern

Still referring to FIGS. 3A and 3B, we form a trench pattern 34 32 in the second dielectric layer 20. The trench pattern is preferably comprised of trenches that are approximately orthogonal (e.g., about perpendicular but in a different plane) to the first level conductive lines. We place trenches 34 32 directly below conductive layer 50 which is a critical layer that will affect the RC delay. The trench 34 exposes the first level first line 14 because layer 50 has to be connected to layer 14. The via is replaced by trench 34. As such the RC delay is improved.

Preferably we form the trenches 32 34 first and then form the via openings 24.

G. Key Feature of the Invention-Supplemental Lines

As shown in FIGS. 4A and 4B, we fill the trenches with a conductive material to form supplemental second lines 38 42. The supplemental (second) lines act as additional (or supplemental) thickness for the (yet to be formed) "second"

level conductive lines hence they are called supplemental "second" lines. There do not need to be first supplementary lines to have 'second" supplementary lines.

As shown in FIGS. 4A and 4B, the supplement line 38 can contact the first level first conductive line 14. This is a desired contact because more contact area and thus lower contact resistance. Also, note that the supplement line 38 does not contact the first level second conductive line 16. This is because we do not want to short line 16 with line 14. Supplemental lien 38 is just to connect an upper & lower lines together. (E.g., 50 and 14).

The supplemental lines are preferably comprised of an Aluminum alloy and preferably not comprised of W. The supplemental lines comprised of Al alloy are preferably formed by CVD Al depositing in the trench openings. 32 34. Alternatively, the Al can be blanket deposited and patterned to form the Al filling the trenches.

H. Second Level Lines 50 52

As shown in FIGS. 5A and 5B, we form second level conductive lines 50 52 over the supplemental second lines 38 42 and the plug 28. The second level conductive lines have critical path areas. For example, FIG. 5A, the line 50 has critical path areas at least over the supplemental lines 38 and 42. Critical path area are determined or identified by the designer. A criteria the designers use to determine the critical path lines are how frequently the lines are accessed. The second conductive lines preferably have a thickness of between about 4000 and 5000 Å.

The combined thickness of the supplemental lines 38 or 42 and the second conductive line 50 is preferably between about 10,000 and 12,000 Å. This is a greater thickness than the second conductive layer 50 alone.

The second level conductive lines are aligned parallel to the trenches. The trenches formed in critical path areas of the second level conductive lines. The second level conductive lines are not formed to contact the first level conductive lines where a contact is not desired.

Preferably in at least portions of the critical path areas of the second level conductive lines 50 52, the supplemental second lines 38 42 underlie the second level conductive lines 50 52 thereby increasing the effective overall wiring thickness in the critical path area thereby improving performance.

The supplement line 38 contacts the first level first line 14 to connect the first level line 14 to the upper metal line 50 (e.g., connect metal 2 (50) to metal 1 (14). The supplement line 38 42 contacts the first level second line 16.

If line 38 contacts line 16 also, this means line 14 and line 16 will be shorted together. Line 42 can contact to line 16 also if the designer decides so. If not, the structure shown in FIGS. 5A and 5B can be used.

For this example, we don't form a plug where line 38 contact the line 14 because with a trench, the amount of Al alloy is more as such resistance is lower, thus RC is better improved.

In FIGS. 5A and 5B, we don't use a supplemental line where the plug 28 contacts the first line because for this example, this is not a critical path and it may not be economical to adopt such a design.

The invention's second supplementary lines can be formed at any metal level (e.g., M1, M2, M3, etc) and is not limited to the second metal level as illustrated in the FIGS.

I. Structure

A preferred embodiment of the structure of the invention is described below.

The conductive lines have an increased thickness in critical path areas. The conductive lines comprise the following:

As shown in FIGS 1A and 1B, a semiconductor structure 10 has a top surface comprised of a first dielectric layer 12.

A plurality (e.g., spaced about parallel) of first level conductive lines 14 16 are over the first dielectric layer 12. The first conductive lines have at least portions that run in a first direction; The first level conductive lines comprised of a first level first conductive line 14 and a second first level conductive line 16.

The first level conductive lines 14 16 are preferably comprised of Al alloy. As shown in FIGS. 2A and 2B, a second dielectric layer 20 is over the first level conductive lines 14 16 and the first dielectric layer 12.

As shown in FIGS. 2A and 2B, a via opening 24 is in the second dielectric layer 20 over a portion of the first level first conductive line 14.

As shown in FIGS. 3A and 3B, a plug 28 fills the via opening 24. The plug 28 is preferably comprised of a barrier layer and a tungsten (W) plug. The plug is preferably formed by a deposition process and chemical-mechanical polish (CMP) (e.g., a damascene process).

As shown in FIGS. 3A and 3B, a trench pattern 34 32 is in the second dielectric layer 20. The trench pattern is preferably comprised of trenches that are approximately orthogonal to the first level conductive lines. The trench pattern is preferably formed using a photolithographic process (e.g., resist, expose, develop, etch, remove photoresist)

As shown in FIGS. 4A and 4B, the trenches are filled with a conductive material to form supplemental second lines 38 42. The conductive material is preferably an Al alloy and is preferably formed by a CVD Al deposition? or a Al depositing and etch/patterning process using photoresist.

As shown in FIGS. 5A and 5B, second level conductive lines 50 52 are over the supplemental second lines 38 42 and the plug 28.

The second level conductive lines are aligned parallel to the trenches. The trenches formed in critical path areas of the second level conductive lines. The second level conductive lines are not formed to contact the first level conductive lines where a contact is not desired. Whereby in the critical path areas of the second level conductive lines 50 52. The supplemental second lines 38 42 underlie the second level conductive lines 50 52 thereby increasing the effective overall wiring thickness in the critical path area thereby improving performance.

In this invention, words describing the alignment of the lines are approximate terms and should be interpreted as such. For example, parallel lines can mean lines that are approximately parallel and deviations of alignment from parallel (e.g., 150 to 230° as opposed to 180°). Also, orthogonal lines may be approximately orthogonal as the intersection of their planes does not have to be 90° (e.g., 60 to 120°). The chip designer may wish to use slightly different alignments.

Although this invention has been described relative to specific insulating materials, conductive materials and apparatuses for depositing and etching these materials, it is not limited to the specific materials or apparatuses but only to their specific characteristics, such as conformal and non-conformal, and capabilities, such as depositing and etching, and other materials and apparatus can be substituted as is well understood by those skilled in the microelectronics arts after appreciating the present invention While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of conductive lines that have supplement lines under the critical path areas of the conductive lines; comprising the steps of:
   a) providing a semiconductor structure having a top surface comprised of a first dielectric layer;
   b) forming a plurality of first level conductive lines over said first dielectric layer; said first conductive lines running in a first direction; said first level conductive lines comprised of a first level first conductive line and a first level second conductive line;
   c) forming a second dielectric layer over said first level conductive lines and said first dielectric layer;
   d) forming a via opening in said second dielectric layer over a portion of said first level first conductive line;
   e) forming a plug filling said via opening contacting said first level first conductive line;
   f) forming a trench pattern in said second dielectric layer; said trench pattern comprised of trenches that are approximately orthogonal to said first level conductive lines;
   g) filling said trenches with a conductive material to form supplemental second lines;
   h) forming second level conductive lines over at least said supplemental second lines and said plug;
   i) said second level conductive lines are aligned parallel to said trenches; said trenches formed in critical path areas of said second level conductive lines; said second level conductive lines have critical path areas; said second level conductive lines are not formed to contact said first level conductive lines where a contact is not desired; whereby in the critical path areas of said second level conductive lines, said supplemental second lines underlie said second level conductive lines in at least portions of the critical path area thereby increasing the effective overall wiring thickness in the critical path area thereby improving performance.

2. The method of claim 1 wherein said first level conductive lines are comprised of Al alloy.

3. The method of claim 1 wherein said first level conductive lines are formed by blank depositing of a conductive layer and patterning said conductive layer.

4. The method of claim 1 wherein said plug is comprised of a barrier layer and a tungsten (W) plug.

5. The method of claim 1 wherein said second supplement line contacts said first level first conductive line.

6. The method of claim 1 wherein the semiconductor structure comprises a substrate is selected from the group consisting of: microelectronics conductor materials; microelectronics semiconductor materials; and microelectronics dielectric materials.

7. A method of fabrication of second level conductive lines and supplemental lines under the critical path areas of the second level conductive lines; comprising the steps of:
   a) providing a semiconductor structure having a top surface comprised of a first dielectric layer;
   b) forming a plurality of first level conductive lines over said first dielectric layer; at least portions said first conductive lines running in a first direction; said first level conductive lines comprised of a first level first conductive line and a first level second conductive line;
      (1) said first level conductive lines are comprised of Al;
      (2) said first level conductive lines are formed by blank depositing of a conductive layer and patterning said conductive layer;
   c) forming a second dielectric layer over said first level conductive lines and said first dielectric layer;
   d) forming a via opening in said second dielectric layer over a portion of said first level first conductive line;
   e) forming a plug filling said via opening;
      (1) said plug comprised of a barrier layer and a tungsten (W) plug;
   f) forming a trench pattern in said second dielectric layer; said trench pattern comprised of trenches that are approximately orthogonal to said first level conductive lines;
   g) filling said trenches with a conductive material to form supplemental second lines;
   h) forming second level conductive lines over at least said supplemental second lines and said plug; said second level conductive lines having critical path areas;
   i) said second level conductive lines are aligned parallel to said trenches; said trenches formed in critical path areas of said second level conductive lines, said second level conductive lines are not formed to contact said first level conductive lines where a contact is not desired; whereby in the critical path areas of said second level conductive lines, said supplemental second lines underlie said second level conductive lines thereby increasing the effective overall wiring thickness in the critical path area thereby improving performance.

* * * * *